United States Patent [19]

Gupta

[11] 4,100,515

[45] Jul. 11, 1978

[54] COMMUNICATION CIRCUIT HAVING PRECISION CAPACITOR MULTIPLIER

[75] Inventor: Shanti Swarup Gupta, Naperville, Ill.

[73] Assignee: Wescom, Inc., Downers Grove, Ill.

[21] Appl. No.: 794,002

[22] Filed: May 5, 1977

[51] Int. Cl.² .................... H03H 7/44; H03H 11/00
[52] U.S. Cl. ............................. 333/80 R; 178/46; 328/127; 333/32
[58] Field of Search ............ H04L/25/10; 333/80 R, 333/80 T, 32; 328/128; 307/230; 178/63 R, 63 E, 45, 46, 69 C; 179/175.3 R

[56] References Cited

U.S. PATENT DOCUMENTS

| | | | |
|---|---|---|---|
| 3,553,609 | 1/1971 | Edge | 333/80 T |
| 4,051,385 | 9/1977 | Greenaway et al. | 333/80 R X |

*Primary Examiner*—Paul L. Gensler
*Attorney, Agent, or Firm*—Leydig, Voit, Osann, Mayer & Holt, Ltd.

[57] ABSTRACT

A precision capacitor multiplier connected in a communication circuit for balancing transmission facility impedances. The circuit requires only a single precision capacitor, and utilizes a plurality of precision resistors selectable to cause the circuit to exhibit one of a plurality of precision capacitance values.

8 Claims, 2 Drawing Figures

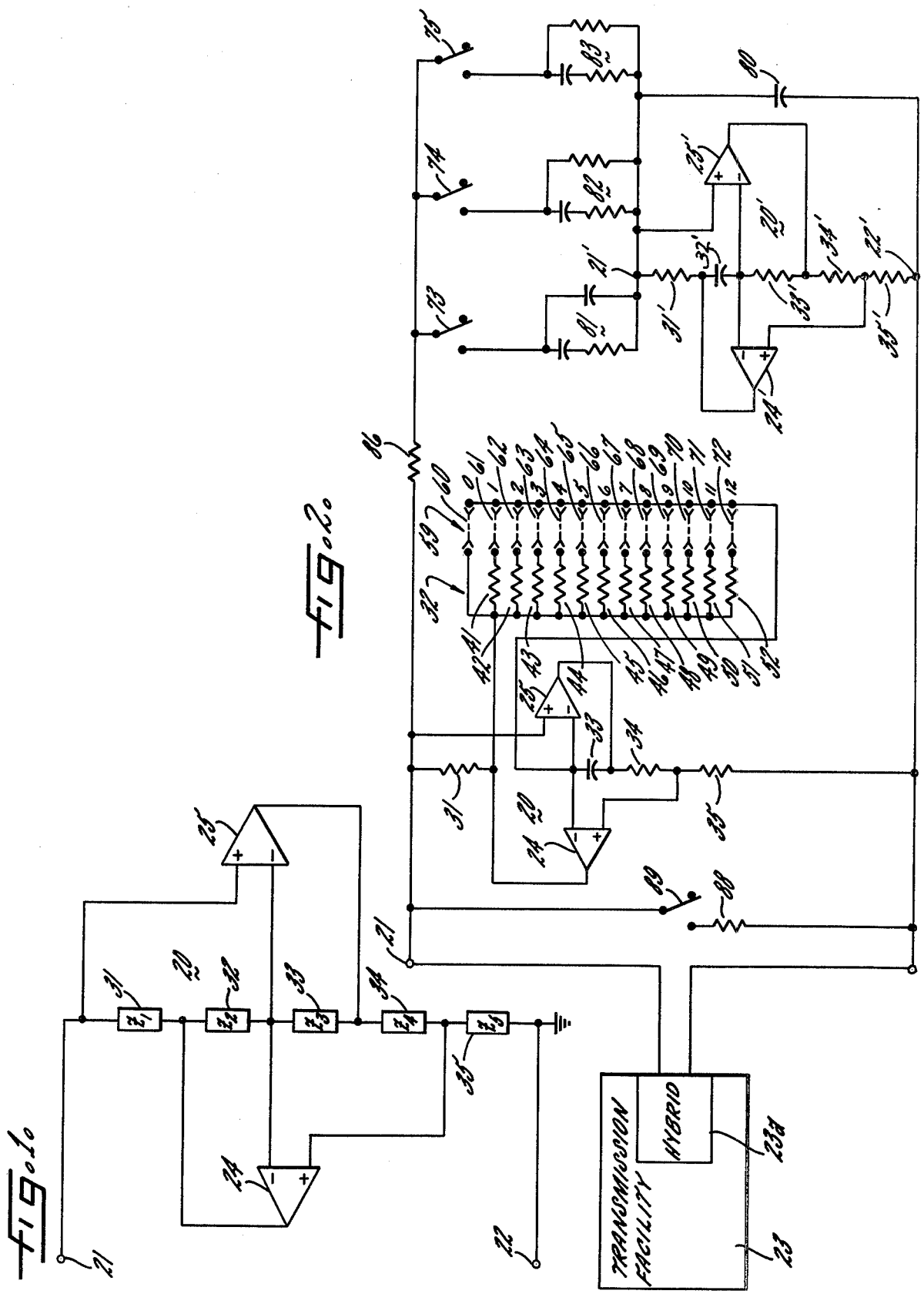

COMMUNICATION CIRCUIT HAVING PRECISION CAPACITOR MULTIPLIER

DESCRIPTION OF THE INVENTION

This invention relates to communication circuits, and more particularly to precision capacitor multipliers in such circuits for balancing transmission facility impedances.

In communication circuits there often exists the need for precision capacitors, for example to balance existing cable impedance characteristics against the designed impedance characteristic of a circuit element connected in the transmission facility. In the case of loaded transmission facilities, the cable type and gauge determines the characteristic impedance of the facility, but the shunt capacitance of the facility seen at a terminating or insertion point varies in accordance with the length of cable between such point and the first loading coil. Thus, if a hybrid amplifier is installed in such a facility, a bal network is associated with the hybrid and is selected in accordance with the characteristic impedance of the facility; the bal network must, however, be shunted by a precision capacitor having a value determined by the length of cable to the first loading coil. Heretofore, several approaches have been considered in order to accomodate the last mentioned requirement. An array of precision capacitors encompassing the necessary range may be associated with a bal network, the capacitors selectable by switches, straps or the like, to provide the capacitance necessary for a given installation. Alternatively, a technician may carry a "kit" of capacitors and select an appropriate one for installation. Considering the relatively high cost of precision capacitors and the even higher cost of such capacitors of non-standard value, the former approach proves to be quite costly; the latter is less costly but rather cumbersome in application. Of course, it is also possible to reduce cost by balancing the cable capacitance only roughly, if the resulting performance degradation can be tolerated.

Other applications exist for precision capacitors, often of relatively large value, such as DX balancing capacitors and termination balancing capacitors in voice frequency communication systems. Providing one or more precision capacitors of comparatively large value is generally quite costly.

In view of the foregoing, it is a general aim of the present invention to provide a communication circuit including a precision capacitor multiplier, using only a single precision capacitor, and capable of multiplying the value of that capacitor by a plurality of precision factors to selectively simulate a plurality of capacitor values for balancing impedances in the communication circuit. In more detail, it is an object of the present invention to provide a precision capacitor multiplier in a communication system for balancing impedances, said capacitor multiplier comprising a gyrator having a transfer function of 1/s provided by a single precision capacitor, and wherein at least one of the gyrator impedances comprises a plurality of precision resistors and selector means for establishing a factor to multiply or divide the precision capacitor value.

According to one aspect of the invention, it is an object to provide a precision balance network for a hybrid, such precision balance network including a first gyrator having a transfer function of s for providing the balance network inductance, and a second gyrator having a transfer function of 1/s, a plurality of precision resistors, and selector means associated with the resistors to provide a range of simulated capacitance sufficient to balance the capacitance of transmission facilities connectable to the hybrid.

Other objects and advantages will become apparent from the following detailed description when taken in conjunction with the drawings in which:

FIG. 1 is a schematic diagram showing a generalized gyrator circuit; and

FIG. 2 is a schematic diagram illustrating a precision balance network including a precision capacitor multiplier exemplifying the present invention.

While the invention will be described in connection with certain preferred embodiments, there is no intent to limit it to those embodiments. On the contrary, the intent is to cover all alternatives, modifications and equivalents included within the spirit and scope of the invention as defined by the appended claims.

Gyrators, and more broadly, generalized impedance converters are known, and have been described in the literature. See, for example, Active Filter Design Using Generalized Impedance Converters by Burton and Treleaven, EDN Feb. 5, 1973, pages 68–75 and The Gyrator — A Practical IC Inductor by Thomas L. Baasch, Electronic Products, April 1970, pages 90–95. As recognized by the literature, an ideal impedance converter is a two port network which, when terminated at one port by an impedance $Z_L(s)$, presents at the other port an impedance proportional to $Z_L(s)$ for all frequencies. Thus, a general impedance converter may be characterized by the following expression:

$$Z_i(s) = K(s)Z_L(s).$$

In an impedance inverter the factor $Z_L(s)$ in the preceding expression is replaced by its reciprocal. A gyrator is a positive impedance inverter in which $K(s)$ is a positive real constant.

The ability of a capacitive loaded gyrator to simulate an inductance has been, perhaps, one of the most popular applications of the gyrator circuit. It is believed that the most typical use of the gyrator circuit is in active filter synthesis wherein gyrators are used to replace grounded inductors of specified values, or after transformation of the filter, gyrators used to realize grounded inductors and D elements.

Although conceptually it is appreciated that gyrators can be loaded to achieve a variety of transfer functions, including a capacitive transfer function, the prior art has failed to appreciate the advantages of a capacitive loaded gyrator simulating a capacitor. Furthermore, such a gyrator, in combination with a switch network for selectively controlling at least one of the resistive impedances in the gyrator circuit, provides an elegant and economical solution to the facility impedance balancing problems which have long confronted the communications industry.

Turning now to FIG. 1, there is shown the generalized schematic of a gyrator circuit which will be used to illustrate the principles of the present invention. The gyrator, generally indicated at 20, has a pair of input terminals 21, 22 across which the gyrated impedance $Z_I$ is exhibited. The gyrator is comprised of two differential amplifiers 24, 25 connected as shown to five serially connected impedances 31–35, such impedances having values of Z1–Z5 respectively.

In more detail, the input terminal 21 is connected to one terminal of impedance 31 and to the non-inverting input of amplifier 25. The other terminal of impedance 31, in addition to being connected to impedance 32 is also connected to the output of amplifier 24. The second terminal of impedance 32 is connected to impedance 33 and to the inverting inputs of amplifiers 24 and 25. The second terminal of impedance 33, in addition to being connected to impedance 34 is connected to the output of amplifier 25. The second terminal of impedance 34 is connected to the impedance 35 and to the non-inverting input of amplifier 24. Finally, the second terminal of impedance 35 is connected to terminal 22.

As is well known, in the general case the impedance of the circuit of FIG. 1, as measured across terminals 21 and 22, is given by the expression:

$$Z_I = \frac{Z_1 Z_3 Z_5}{Z_2 Z_4}$$

In a typical gyrator application, either of impedances 32 or 34 is made capacitive, with the remaining impedances being resistors, in which case the circuit simulates an inductive impedance having a magnitude determined by the foregoing expression. When it is desired to cause the gyrator to exhibit the characteristics of a D element, two of impedances 31, 33 or 35 are made capacitive, with the remaining impedances being resistors.

In accordance with the invention a gyrator circuit is used as a balancing capacitor in a transmission facility with impedance $Z_3$ of the gyrator being a capacitor, the remaining impedances being resistors, one of such resistors having selector means associated therewith to cause the circuit to selectively simulate one of a predetermined number of capacitive values to properly balance the facility in which the circuit is located.

For the purpose of illustrating the structure and operation of the precision capacitor multiplier in a transmission facility, FIG. 2 shows a precision balance network capable of use in hybrids, hybrid amplifiers and the like. Attention will first be focused on the leftmost portion of FIG. 2, showing the precision capacitor multiplier itself. It will be appreciated that while the capacitor multiplier is shown in combination with additional impedance elements to function as a balance network, the capacitor multiplier may be used in a transmission facility either alone or with impedance elements of different form for the purposes described herein.

With that in mind, and turning to FIG. 2, there is shown a gyrator 20 forming a multi-value precision capacitor multiplier and including serially connected impedances 31–35 and a pair of differential amplifiers 24, 25. The terminals 21, 22 of the gyrator are connected to a transmission facility schematically indicated at 23 and including hybrid 23a. In the present case impedances 31, 34 and 35 are fixed resistors, preferably of precision value to establish a predetermined ratio. Impedance 33 is a precision capacitor whose value will be multiplied or divided by a factor to determine the magnitude of the capacitance simulated by the gyrator. Impedance 32 comprises a plurality of individual precision resistors 41–52 associated with switch means 59, in the present case comprising a plurality of jumpers 60–72. The jumper 60 has no resistor associated therewith, being connected directly to the common junction of the resistors for purposes which will soon become apparent. The common junction of the resistors 32 is connected to the resistor 31 while the common junction of the jumpers is connected to the capacitor 33. Thus, the value of resistor 32 is determined by the state of switch means 59. For this case, the statement for the input impedance of the gyrator becomes:

$$Z_I = \frac{(R_{31})(R_{35})(1/sC)}{(R_{34})(R_{32} \text{ variable})}.$$

Because $R_{31}$, $R_{34}$ and $R_{35}$ are fixed resistors in the present example, a factor K is established based on the following ratio:

$$K = \frac{(R_{31})(R_{35})}{(R_{34})}$$

Thus, for the illustrated multi-value capacitor multiplier, the input impedance may be expressed as follows:

$$Z_1 = \frac{K}{(R_{32} \text{ variable})(sC)}.$$

It will now be apparent that manipulation of the switch means 59 establishes a value of $Z_2$ which determines the impedance of the capacitor circuit for that case, that is, the magnitude of the simulated capacitance. The capacitive magnitude depends on the relationship of K and $R_{32}$, which establish a factor by which the value of capacitor 33 is multiplied. Because such factor may be greater than, equal to or less than 1, it will be apparent that division is encompassed within the term multiplication as used herein. In the illustrated embodiment, with resistor 32 comprised of 12 selectable resistors, and with the switch means 59 manipulatable to insert only one at a time of such resistors into the circuit, the multi-value capacitor is capable of simulating 12 distinct, precision capacitive values. Furthermore, the jumper 60 when brought into play makes the value of resistor 32 substantially zero, so that the simulated capacitance of the multiplier is approximately zero, or the capacitive impedance virtually infinite.

It should be noted that the illustrated capacitor multiplier is only one of the circuit configurations capable of performing as described above, and that is is within the scope of the invention to modify the gyrator circuit, such as by associating selector means with impedance other than resistor 32, to achieve equivalent performance.

The significance of the capacitor multiplier described herein is further emphasized by the combination of this circuit with additional components to form a precision balance network as illustrated in FIG. 2. By way of background it is noted that precision balance networks are used, for example in hybrid amplifiers, for matching the phase characteristics of the transmission facility in which the hybrid amplifier is connected. Typically, a plurality of such balance networks are available to a technician when installing a hybrid amplifier. Such technician selects one of the many precision balance networks available to him in dependence on the type and gauge of cable as well as on the length of cable to the first loading coil. The function of the precision balance network is to provide a phase shift characteristic to the hybrid which matches the phase shift characteristic of the transmission facility for minimizing reflections at the four wire ports of the hybrid. Typically, the phase shift characteristic is provided by an arrangement of inductors, capacitors and resistors having values which match the characteristic impedance for the type and gauge of the particular cable for which the balance network is intended. This circuit is then shunted by a precision capacitor dependent upon the length of cable to the first loading coil.

In the instant precision balance network, to complement the miniaturization and cost effectiveness achieved by the illustrated precision capacitor multiplier, the inductor is achieved by a capacitive loaded gyrator indicated at 20'. In the gyrator 20', the impedance 32' is a capacitor while the impedance 31' and 33'-35' are all resistors. For H88 loaded cable, the impedances 31'-35' are selected so that the gyrator exhibits an inductance of approximately 30.2 millihenries. A capacitor 80 is connected in parallel with this inductor and, for H88 loaded cable, typically has a value of 0.044 microfarads.

The illustrated precision balance network may be used with three different gauges of cable, for example the aforementioned H88 of 22, 24 and 26 gauge. To that end, three separate impedance networks 81, 82 and 83 are provided, selectively connectable in series with the inductor for establishing the phase shift characteristic to match the desired cable gauge. Switch 73 is operated when using 22 gauge H88 cable, switch 74 for 24 gauge and switch 75 for 26 gauge, to insert networks 81, 82 or 83 respectively to achieve the necessary phase shift characteristic. Resistor 86 is connected in series circuit relationship with any of the three selected impedance networks. A further resistor 88 may be connected across the terminal 21, 22 by closure of a switch 89. The switch 89 is closed when the network is used in transmission facilities of light gauge and short length, in the illustrated embodiment being closed for 26 gauge cable of 2700 feet or less length to the first loading coil.

Whereas the switches just described are adjusted to match the phase characteristics of the balance network to that of the facility, the switch means 59 is adjusted to balance the cable capacitance resulting from the length of cable to the first loading coil. Closing one of the switches 60-72 inserts the associated resistor into the circuit to set the multiplication factor for a desired output capacitance. In order to determine which resistor should be connected, the length of cable to the first loading coil is determined. In the illustrated embodiment, taking 1200 feet as a zero reference, the number of 300 foot sections of additional length is determined. Taking the jumper 60 as corresponding to zero sections 61 as one, and so on with jumper 72 corresponding to 12 sections, the appropriate jumper is connected in dependence upon the number of sections beyond 1200 feet. If, for example, there were approximately 1200 feet of cable to the first loading coil the "zero section" jumper 60 would be connected making the multiplication factor zero, and causing the circuit to exhibit substantially zero capacitance. If the cable length were approximately 2700 feet, this would imply five sections beyond 1200 feet, requiring the connection of the "five section" jumper 65. Thus, resistor 45 would function as impedance 32, and would provide a factor in the foregoing expression which would cause the gyrator 20 to exhibit a capacitance necessary to balance the 2700 feet of cable.

The advantages of the precision capacitor network in a communication circuit will be apparent from the foregoing. Considering the case just illustrated the precision capacitor may be easily adjusted to assume any one of 12 precision capacitor values and zero. Not only is the technician provided with the ready ability to accurately match the capacitance of the line length encountered, and further afforded with the ability to do so simply by installing a single jumper or strap, but this ability is achieved at the expense of only a single precision capacitor. In combination with a second gyrator for providing the necessary inductance, the entire precision balance network becomes quite miniaturized. Furthermore, due to the fact that the majority of precision components in the circuit are simply resistors, the circuit is quite inexpensive to manufacture.

It is emphasized that the examples given above with respect to H88 loaded cable are not intended to be limiting, but merely illustrative of the present invention. Not only is the capacitor multiplier adaptable for use with precision balance networks for other cable types, but, as noted above, in equipment in addition to precision balance networks.

To further illustrate the advantages attendant to the instant construction, a specific circuit example for the capacitor multiplier will be offered. Again, this example is offered for an illustrative rather than a limiting purpose. In an exemplary embodiment of the invention, resistors 31, 34 and 35 were each precision resistors of 3K ohms. This established the factor K at 3,000. The capacitor 33 was a precision capacitor having a standard value of 0.1 microfarads. The resistors 41-52 were precision resistors having graded values ranging from resistor 41 of 200 ohms, resistor 42 of 290 ohms, resistor 43 of 450 ohms, resistor 44 of 550 ohms, resistor 45 of 740 ohms, resistor 46 of 860 ohms, resistor 47 of 1000 ohms, resistor 48 of 1100 ohms, resistor 49 of 1200 ohms, resistor 50 of 1360 ohms, resistor 51 of 1500 ohms and resistor 52 of 1680 ohms, providing a sufficient range of output capacitance to balance facility capacitances encountered. For the minimum cable length with jumper 60 installed the capacitor multiplier exhibited a capacitance of substantially zero microfarads. Installation of jumper 61 resulted in an exhibited capacitance of about 0.00667 microfarads. For the maximum cable length of 4800 feet, (3600 feet beyond the 1200 foot zero reference), the circuit exhibited a capacitance of about 0.056 microfarads. In addition, the circuit allowed the balancing of cable lengths intermediate the extremes in increments of 300 feet.

In the foregoing example, all of the capacitor values simulated by the capacitor multiplier were factors of the precision capacitor which were less than one. It is entirely possible, as noted above to configure the circuit so that the capacitance exhibited could be both above and below the value of the precision capacitor. For example, if a 0.01 microfarad capacitor were selected, and the value of K decreased by a factor of 10, the circuit would exhibit the same capacitance range, but such range would be both above and below the value of the 0.01 microfarad capacitor.

Of further significance is the fact that the multiplier may be considerably greater than 1. This allows precision DX and terminating balancing capacitance of 4 microfarads or more to be achieved using a generally available and comparatively less expensive 0.1 microfarad precision capacitor. The capacitor multiplier has proven to operate effectively with factors in the range between 0.01 and 100, to multiply a precision capacitor by such factor to achieve a wide range of output capacitance. Furthermore, the ready ability to generate precision non-standard capacitor values will be apparent from the foregoing.

It will be apparent that the term "transmission facility" is used herein in the broad sense to generically described communication circuitry connected to the precision capacitor multiplier or precision balance network. For example, in the illustration of FIG. 2, the transmission facility schematically indicated at 23 quite obviously includes the hybrid circuit 23a itself, only the precision balance network being shown in detail.

It will now be appreciated that what has been provided is a balancing impedance in a transmission facility comprising a capacitor multiplier, such multiplier being capable of exhibiting a plurality of capacitive values in dependence upon the selection of one of a plurality of precision resistors.

I claim as my invention:

1. In transmission facilities of the type capable of exhibiting a shunt capacitance within a predetermined range dependent on the physical characteristics of the facility, a precision capacitor multiplier in said facility comprising, terminal means connected to said facility, first through fifth impedances serially connected between said terminal means, first and second amplifier means connected to said serially connected impedances to form a gyrator circuit, the centermost one of said impedances being a precision capacitor, the other four of said impedances being resistors, at least one of said resistors comprising a plurality of individual precision resistors and selector means associated therewith for selectively connecting said resistors in said serial connection, whereby said selector means establishes a factor for multiplying the value of said precision capacitor, said factor being selectable in a range sufficient to balance the capacitance of said transmission facility over said predetermined range.

2. The transmission facility as set forth in claim 1 wherein the shunt capacitance of said facility varies in accordance with the length of at least a portion of said facility, said individual precision resistors being of graded value associated with respective increments of facility length, said selector means being associated with increments of facility length to directly select a particular one of said individual precision resistors.

3. In a communication system having a capacitance characteristic within a predetermined range, and circuit means connected to said communication system, a precision multi-value capacitor multiplier associated with said circuit means for balancing the capacitance of said communication system, said capacitor multiplier comprising first and second amplifier means and first through fifth impedance means connected as a gyrator, three of said impedance means being resistive and establishing a constant K for said gyrator, a fourth of said impedance means being a precision capacitor and establishing a transfer function for said gyrator of 1/sC, said fifth impedance means comprising a plurality of precision resistors and switch means for selectively connecting said resistors as said fifth impedance, whereby operation of said switch means causes said gyrator to exhibit a capacitance which is a precision factor of said precision capacitor; the factor K, the value of the capacitor and the values of the resistors comprising said fifth impedance being selected to provide said gyrator with a selectable range of simulated capacitance sufficient to compensate said communication system.

4. The communication system as set forth in claim 3 wherein the capacitance characteristic of said system varies in accordance with the length of at least a portion of said system, said precision resistors being of graded value associated with respective increments of system length, said switch means being associated with increments of system length to directly select a particular one of said precision resistors.

5. In a transmission facility having a hybrid circuit connected therein, a precision balance network connected in said facility to said hybrid circuit comprising a first gyrator circuit comprising first through fifth serially connected impedances and first and second amplifiers connected to said impedances, one of the second or fourth of the serially connected impedances being a capacitor, the remaining impedances being resistors so that said gyrator simulates an inductive impedance, resistor-capacitor circuit means connected to said gyrator to provide a phase characteristic which matches the characteristic of said transmission facility, and a second gyrator circuit comprising sixth through tenth serially connected impedances and third and fourth amplifiers connected to said impedances, the centermost one of said last mentioned impedances being a precision capacitor and the remainder of said impedances being resistors, at least one of said resistors in said second gyrator comprising a plurality of precision resistors and selector means associated therewith for selectively connecting said resistors in said second gyrator circuit, so that said second gyrator is selectively switchable to simulate a plurality of precision capacitor values, said second gyrator circuit being connected across the input terminals of said precision balance network to precisely balance the capacitance of said transmission facility.

6. The transmission facility as set forth in claim 5 wherein the capacitance of said facility varies in accordance with the length of at least a portion of said facility, said selectable precision resistors being of graded value associated with respective increments of facility length, said selector means being associated with increments of facility length to directly select a particular one of said selectable precision resistors.

7. The transmission facility as set forth in claim 5 wherein the resistor-capacitor circuit means connected to said first gyrator comprises a plurality of resistor-capacitor circuits associated with phase characteristics of respective facility type, and second selector means for selectively connecting said resistor-capacitor circuits to said first gyrator, whereby said precision balance network may be adjusted to match the phase characteristic of a plurality of facility types.

8. The transmission facility as set forth in claim 7 wherein the capacitance of said facility varies in accordance with the length of at least a portion of said facility, said selectable precision resistors being of graded value associated with respective increments of facility length, the first selector means being associated with increments of facility length to directly select a particular one of said selectable precision resistors.

* * * * *